United States Patent [19]
Dennis

[11] Patent Number: 4,710,261
[45] Date of Patent: Dec. 1, 1987

[54] APPARATUS AND METHOD FOR MAINTAINING A UNIFORM ETCHING SOLUTION COMPOSITION

[75] Inventor: Timothy A. Dennis, Bloom Township, Wood County, Ohio

[73] Assignee: RCA Corporation, Princeton, N.J.

[21] Appl. No.: 7,858

[22] Filed: Jan. 28, 1987

[51] Int. Cl.$^4$ .......................................... H01L 21/306
[52] U.S. Cl. .................................... 156/626; 156/642; 156/665
[58] Field of Search ...................... 156/626, 642, 665; 436/55; 422/111

[56] References Cited

U.S. PATENT DOCUMENTS

| | | | |
|---|---|---|---|
| 2,650,157 | 8/1953 | Cochran | 156/626 |
| 4,060,097 | 11/1977 | Oxford | 156/642 |
| 4,132,585 | 1/1979 | Oxford | 156/626 |
| 4,400,270 | 8/1983 | Hillman | 436/55 |
| 4,493,745 | 1/1985 | Chen et al. | |
| 4,615,761 | 10/1986 | Tada et al. | 156/626 |

FOREIGN PATENT DOCUMENTS 2052339 1/1981 United Kingdom ................ 156/643

OTHER PUBLICATIONS

Quantitative Analytical Chemistry 2nd Ed. Flaschka, Barnard, Jr., Sturrock, Willard Grant Press Boston, MA, 1980.

*Primary Examiner*—S. Leon Bashore
*Assistant Examiner*—Lori-Ann Cody
*Attorney, Agent, or Firm*—S. C. Corwin; B. E. Morris

[57] ABSTRACT

An apparatus and method are disclosed for replenishing the depleted component of a multicomponent etching solution. A portion of the etching solution is analyzed with a UV detector to determine the concentration of the depleted component. An output signal is produced by the UV detector which is a function of the depleted component's concentration. In response to this output signal, a microprocessor is used to control the amount of make-up solution, enriched with the depleted component of the multicomponent etching solution, which is added to the etching solution. With the use of this system, a substantially uniform etch bath composition is maintained.

6 Claims, 1 Drawing Figure

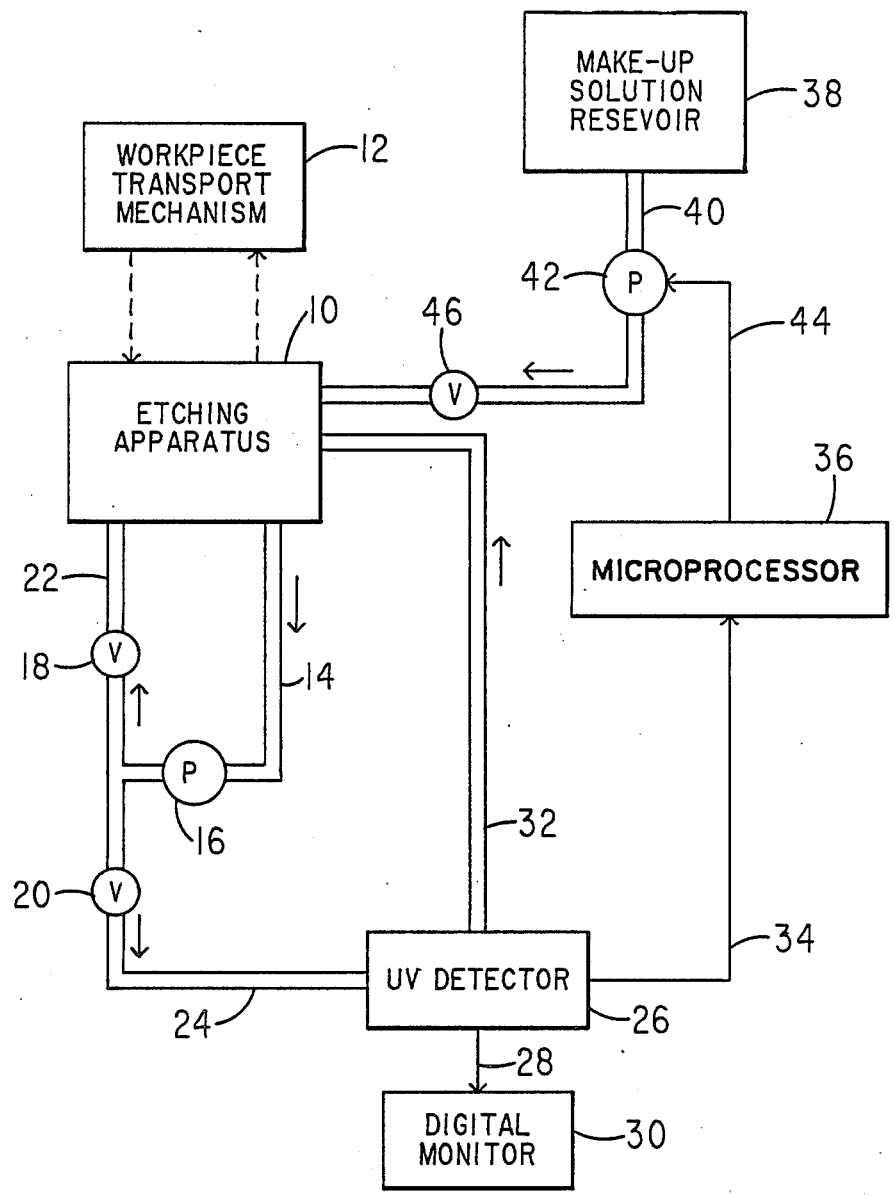

APPARATUS AND METHOD FOR MAINTAINING A UNIFORM ETCHING SOLUTION COMPOSITION

The present invention relates to both a method and apparatus for replenishing the depleted component of a multicomponent etching solution. More particularly, a make-up solution enriched with the depleted component is added to the etching solution in a controlled manner so that a substantially uniform etching solution composition is maintained.

BACKGROUND OF THE INVENTION

Aluminum and aluminum-silicon alloys are typically used as the interconnect materials for semiconductor devices. The aluminum or the aluminum-silicon alloy is deposited over a semiconductor wafer during the latter stages of the device fabrication process. Then, a photoresist is applied, exposed, and developed to define the metallization pattern. Using the resist as a mask, the exposed portions of the aluminum or aluminum-silicon alloy are removed using a wet etching process. The photoresist pattern is removed and the desired metallization pattern is formed.

In the wet etching process, the semiconductor wafer with the metallization layer is contacted with an acid etching solution, such as an aqueous solution of phosphoric ($H_3PO_4$) and nitric ($HNO_3$) acids. However, it has been found that after a period of time the etch rate of the metallization pattern decreases. As the etch rate decreases, the wafers are etched in an uneven manner whereby portions of the metallization pattern are underetched or overetched.

It was also observed that a precipitate builds up within the etch tank when the etch rate decreased. This indicates that the nitric acid concentration has become depleted. The nitric acid concentration is reduced because the acid is consumed during the etching of the aluminum or aluminum-silicon metallization also, some of the nitric acid depletion can be attributed to evaporation. Previously, when the etch rate reached unacceptable levels, the entire etch bath was disposed of and replaced with a fresh etching solution. It would be desirable to replenish the depleted nitric acid so that the downtime of the etching operation is reduced and so that the wafer is etched in a substantially uniform manner throughout the life of the bath.

It is known in the etching art to monitor the etching solution so that the solution can be continuously regenerated. For example, in U.S. Pat. No. 4,058,431 to R. Haas, entitled "Method of Etching Copper and Copper Alloys," issued Nov. 15, 1977, a method is disclosed for using both pH and specific gravity measurements to monitor the etching solution. In response to these measurements, the appropriate components of the etching solution are added so as to continuously regenerate the etching solution. However, it has been found that pH measurements are not sensitive enough to detect the subtle compositional changes in the $H_3PO_4$-$HNO_3$ etching solution used to etch metallization patterns on semiconductor wafers.

SUMMARY OF THE INVENTION

The present invention includes both a method and an apparatus for replenishing the depleted component of a multicomponent etching solution with a make-up solution. A UV detector means is placed in communication with at least a portion of the etching solution for producing an output signal which is proportional to the concentration of the depleted component. A delivery means is provided for supplying the make-up solution to the etching solution in a controlled manner responsive to the output signal, whereby a substantially uniform etching solution composition is maintained.

BRIEF DESCRIPTION OF THE DRAWING

The FIGURE is a schematic view of a form of an apparatus which can be used in the present invention for replenishing the depleted component of a multicomponent etching solution with a make-up solution.

DETAILED DESCRIPTION OF THE PREFERRED EMBODIMENT

As shown in the FIGURE, the present invention includes a conventional etching apparatus 10. This etching apparatus 10 is generally a tank which houses the etching solution. Since the metallization on a semiconductor wafer is being etched, the etching apparatus 10 will contain a multicomponent etching solution comprising about 96.5% by volume $H_3PO_4$ (85% by weight) and about 3.5% by volume $HNO_3$ (70% by weight). The etching apparatus 10 also includes a heating means since the etching solution is maintained at about 53° C. A workpiece transport mechanism 12 is provided for introducing and removing the semiconductor wafers from the etching apparatus 10.

A conduit 14 is provided with a pump 16 for removing a portion of the multicomponent etching solution from the etching apparatus 10. Valves 18 and 20 are provided for regulating the amount of etching solution which is returned to the etching apparatus 10 by a conduit 22 or removed from the etching apparatus by a conduit 24. The etching solution which is removed by the conduit 24 is passed through a commercially available UV detector 26, such as the LDC UV monitor supplied by Applied Science, having a wavelength of about 280 nanometers. The UV detectors 26 produces an output signal which is a function of the $HNO_3$ concentration. This output signal may be transmitted by a line 28 to a digital monitor 30 to display a value which is a function of the $HNO_3$ concentration. The output signal is also transmitted by a line 34 to a commercially available microprocessor 36, such as the Omron S6 programable controller. After the etching solution has been analyzed, it is then returned to the etching apparatus 10 by a conduit 32.

The microprocessor 36 is used to control the amount of make-up solution which is added to the etching apparatus 10 to replenish the depleted $HNO_3$. Calibration experiments are conducted using etching solutions with known $HNO_3$ concentrations to determine the volume of make-up solution which must be added to the etching apparatus 10 to maintain a constant etching solution concentration. A program based on the calibration data, is written and entered into the microprocessor 36. A line 44 is also provided for transmitting the control signal from the microprocessor 36 to a delivery means which includes a commercially available metering pump 42, such as the Gorman-Rupp No. 14250-007.

The make-up solution enriched in $HNO_3$ is housed within a reservoir 38. This make-up solution comprises about 10-30% by volume $HNO_3$ (70% by weight) and about 70-90% by volume $H_3PO_4$ (85% by weight) and, more particularly, about 15% by volume $HNO_3$ (70% by weight) and about 85% by volume $H_3PO_4$ (85% by weight). When the 15:85 HNO$_3$ to H$_3$PO$_4$ make-up solution is utilized to replenish the HNO$_3$ concentration, the etching solution in the etching apparatus 10 is not shocked. Shocked is a term used to denote sudden changes in the etching characteristics, such as eratic etch rates and uneven etching of the metallization. Therefore, a substantially uniform etch rate is maintained, an insoluble precipitate is not produced and nitrous oxide is not visually observed to be released when the make-up solution is added. Rapid addition of concentrated HNO$_3$ produces a gaseous release of nitrous oxide.

A conduit 40, containing the metering pump 42 and a valve 46, is used as the delivery means to deliver the make-up solution to the etching apparatus 10. In response to the output signal from the UV detector 26, the microprocessor 36 produces a control signal which actuates the metering pump 42 for a time period sufficient to introduce enough make-up solution to bring the HNO$_3$ concentration within the etching apparatus 10 back to the desired level. The output signal from the UV detector 26 is sampled by the microprocessor 36 about every half hour; however, other sampling rates may be used depending on the rate in which the HNO$_3$ is being depleted.

Before the replenishing system of the present invention has implemented, the etch bath life was limited to approximately 400 wafers (approximately 200 wafers with aluminum metallization and approximately 200 wafers with aluminum-silicon metallization). Poor line demarcation was also visible on the wafers which were etched during the latter stages of the etch bath life. However, when the system of the present invention was utilized, the etch bath lifetime increased to approximately 1400–1600 wafers when an equal distribution of aluminum and aluminum-silicon metallized wafers is etched. This increased etching solution lifetime significantly reduces the downtime and the disposable costs associated with the acid etching solution. Also, with the present invention, the precipitate build-up is substantially reduced. Since the etching solution composition remains substantially constant, the etch rate of the metallization layer remains uniform thereby substantially eliminating both overetching and underetching. Thus, a more constent metal line width is achieved.

Although the present invention has been described for etching the metallization on a semiconductor wafer, it would also have utility in other areas. For example, the replenishment system could be used with any etch bath or chemical treatment solution wherein the concentration of the components can be analyzed through the use of UV absorption.

I claim:

1. A method of etching at a substantially uniform rate a metallization layer disposed on a substrate, comprising the steps of:

contacting said metallization layer with an etching solution comprising HNO$_3$ and H$_3$PO$_4$;

sampling at least a portion of said etching solution with a UV detector to produce an output signal which is a function of the HNO$_3$ concentration; and delivering a make-up solution comprising HNO$_3$ and H$_3$PO$_4$ in controlled amounts responsive to said output signal to said etching solution, whereby a substantially uniform HNO$_3$ concentration is maintained within said etching solution.

2. A method as recited in claim 1 wherein said UV detector has a wavelength of about 280 nanometers.

3. A method as recited in claim 3 wherein said make-up solution comprises about 10–30% by volume HNO$_3$ (70% by weight) and about 70–90% by volume H$_3$PO$_4$ (85% by weight).

4. A method as recited in claim 3 wherein said make-up solution comprises about 15% by volume HNO$_3$ (70% by weight) and about 85% by volume H$_3$PO$_4$ (85% by weight).

5. A method as recited in claim 4 wherein said etching solution comprises about 96.5% by volume H$_3$PO$_4$ (85% by weight) and 3.5% by volume HNO$_3$ (70% by weight).

6. A method as recited in claim 5 wherein said metallization layer comprises an aluminum-silicon alloy or aluminum and said substrate is a semiconductor wafer.

* * * * *